United States Patent
Kusyk et al.

(10) Patent No.: US 6,336,814 B1
(45) Date of Patent: Jan. 8, 2002

(54) FLEXIBLE CABLE I/O MODULE SYSTEM

(75) Inventors: Richard G. Kusyk, Ottawa; Richard G. Murphy; Bruce Irwin Dolan, both of Kanata; Craig Donald Suitor, Nepean, all of (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/606,066

(22) Filed: Jun. 29, 2000

(51) Int. Cl.⁷ ............................................... H01R 12/00

(52) U.S. Cl. ........................................... 439/61; 439/65

(58) Field of Search ............................... 439/61, 65, 59; 361/683, 686, 788, 792, 801, 802, 796, 784, 730

(56) References Cited

U.S. PATENT DOCUMENTS

| 4,401,351 | A | * | 8/1983 | Record ........................ 439/61 |
| 4,498,717 | A |   | 2/1985 | Reimer .................. 339/17 LM |
| 4,744,006 | A |   | 5/1988 | Duffield ...................... 361/413 |
| 5,546,282 | A |   | 8/1996 | Hill et al. .................... 361/796 |
| 5,769,644 | A |   | 6/1998 | Murphy et al. .............. 439/61 |

* cited by examiner

Primary Examiner—Gary Paumen
Assistant Examiner—Ross Gushi

(57) ABSTRACT

A shelf for housing printed circuit packs in which a backplane has a connector along its top or bottom edge. Connector modules are connected to the backplane by vertical attachment to the backplane edge connector such that the connector modules are located above or below the backplane. The connector modules may be oriented either to be front facing or rear facing. The backplane connector is adapted to accept modules of varying widths and having different connectors thereon.

27 Claims, 11 Drawing Sheets

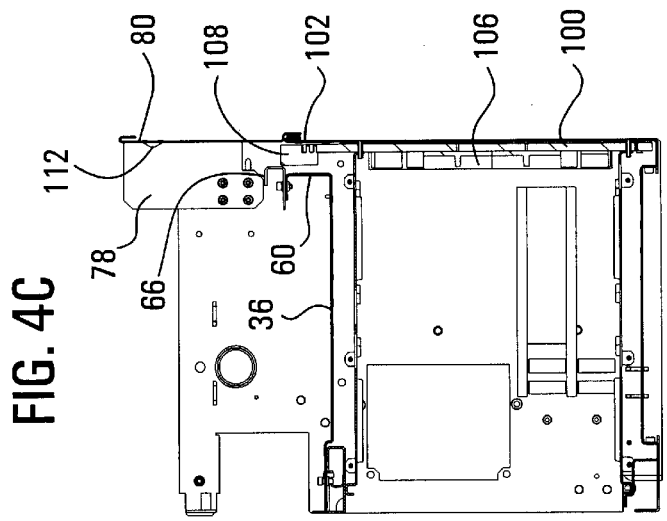
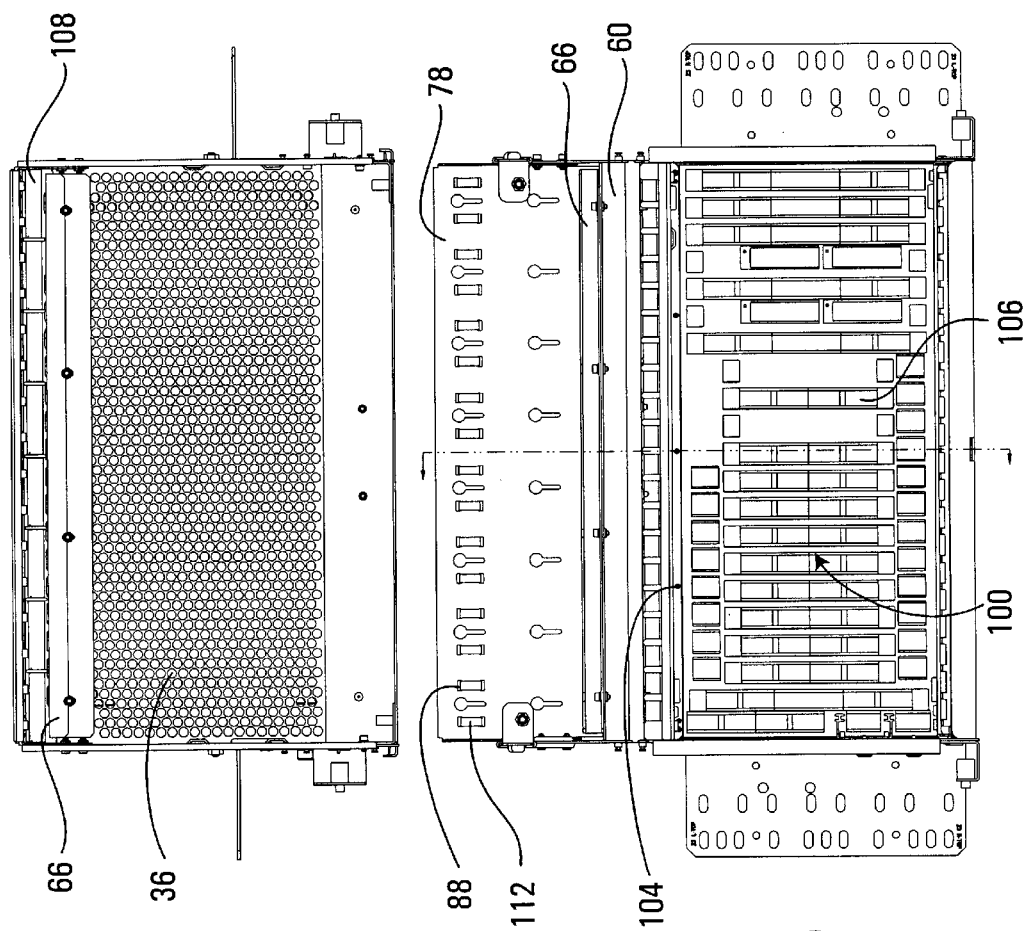
FIG. 4C
FIG. 4A
FIG. 4B

US 6,336,814 B1

FLEXIBLE CABLE I/O MODULE SYSTEM

FIELD OF THE INVENTION

This invention relates generally to shelves for housing printed circuit packs (PCPs) and more particularly to the provision of input and output (I/O) connectors for cable connections to PCPs housed in shelves.

BACKGROUND OF THE INVENTION

Shelves for housing PCPs face significant space restrictions. This is particularly so for shelves located in a central office of a telephone switching service provider. The space available is dictated by the height, width and depth of the racks which a service provider uses for holding the shelves. It is important to provide both the maximum functionality and the maximum flexibility in the space provided.

A shelf typically has a Printed Circuit Board (PCB) extending across the rear, referred to as a backplane, which has a series of edge connectors on its front face. Either PCPs or modules are oriented perpendicular to the backplane and plugged into the edge connectors on the backplane. The edge connectors are generally generic so that a variety of different modules may alternatively be plugged into the same position in the backplane.

I/O connections for carrying input and output signals can also be made through the backplane. Typically a fixed pattern of cable connectors are mounted on the back surface of the backplane. There are several disadvantages to this mode of enabling cable connections. First, access to the cable connectors is only available from the rear of the backplane. Second, the number and type of cable connectors is fixed. This limits the combinations of modules which can be plugged into the backplane based on the type of I/O connection they require. Third, the mounting of the cable connectors on the rear of the backplane means that the backplane must sit sufficiently forward in the rack to accommodate their presence. This limits the usable depth of rack and, by extension, the width of the modules which may be plugged into the backplane.

One solution which has been tried is to extend the height of the backplane and to design the layout of the backplane such that the cable connectors are mounted on the front of the backplane. This design, however, retains the limitation that the number and type of cable connectors is fixed.

SUMMARY OF THE INVENTION

The present invention is directed to an improved shelf for housing PCPs. A backplane located at the rear of the shelf is provided with an edge connector along its top or bottom edge. A variety of different modules containing different cable connectors are adapted for insertion into the backplane edge connector such that they are positioned vertically above or below the backplane. The modules having different types of cable connectors of differing widths may be interchangeably inserted into the backplane edge connector. The difference between the width of the module and the width of the backplane is such that a multiple number of modules may be inserted into the edge connector. The selection of which connector modules are inserted into the backplane is dependent upon the type of connectors required. The backplane may be configured such that the modules face either forward or rearward.

Advantageously, the number and type of connectors needed for any particular configuration of modules within the shelf does not need to be predetermined. Instead, the appropriate connector modules may be plugged into the backplane after the shelf has been installed and the modules within the shelf have been plugged in.

Also advantageously, the number of I/Os available in a standard sized rack may be increased.

Additionally, the density of connectors on a connector card can be adapted to meet user requirements without the need to alter the backplane or other elements of the system in any way.

Further, since the backplane may sit more rearwardly in the shelf, the size, and consequently the functionality, of the PCPs which connect into the backplane may be increased.

The invention may be summarized according to a first broad aspect as a shelf for housing printed circuit boards comprising an open front; a pair of sides extending from a rear to the open front of the shelf, the sides being spaced apart at opposite ends of a shelf space; a backplane extending across the rear of the shelf; a plurality of side-by-side receiving stations located in the shelf space for printed circuit boards to be received through the open front for connection to the backplane; at least one connector module releasably electrically connected to the backplane and extending vertically from and substantially parallel to the backplane; the connector module having a plurality of connectors which extend in a front to rear direction of the shelf.

The invention may be summarized according to another broad aspect as a connector module adapted for connection to a backplane comprising: a printed circuit board; a plurality of cable connectors mechanically and electrically connected to the printed circuit board and extending substantially perpendicular to the printed circuit board; an edge connector mechanically and electrically connected to an edge of a printed circuit board; the edge connector adapted to releasably mate with an edge connector on the backplane such that the module extends vertically from and substantially parallel to the backplane.

The invention may be summarized according to a further broad aspect as a backplane and connector module assembly for use with a shelf for housing printed circuit boards comprising at least one connector module releasably electrically and mechanically connected to the backplane and extending vertically from and substantially parallel to the backplane; the connector module having a plurality of connectors each of which extends in a front to rear direction of the backplane.

Other aspects and features of the invention will become apparent to those ordinarily skilled in the art upon review of the following description of specific embodiments of the invention in conjunction with the accompanying figures.

BRIEF DESCRIPTION OF THE DRAWINGS

Preferred embodiments of the invention will now be described with reference to the attached drawings in which:

FIGS. 4A, 4B and 4C respectively depict a top view, a front view and a cross-sectional view of the shelf of FIG. 1;

DETAILED DESCRIPTION OF THE EMBODIMENT

Figure 1:
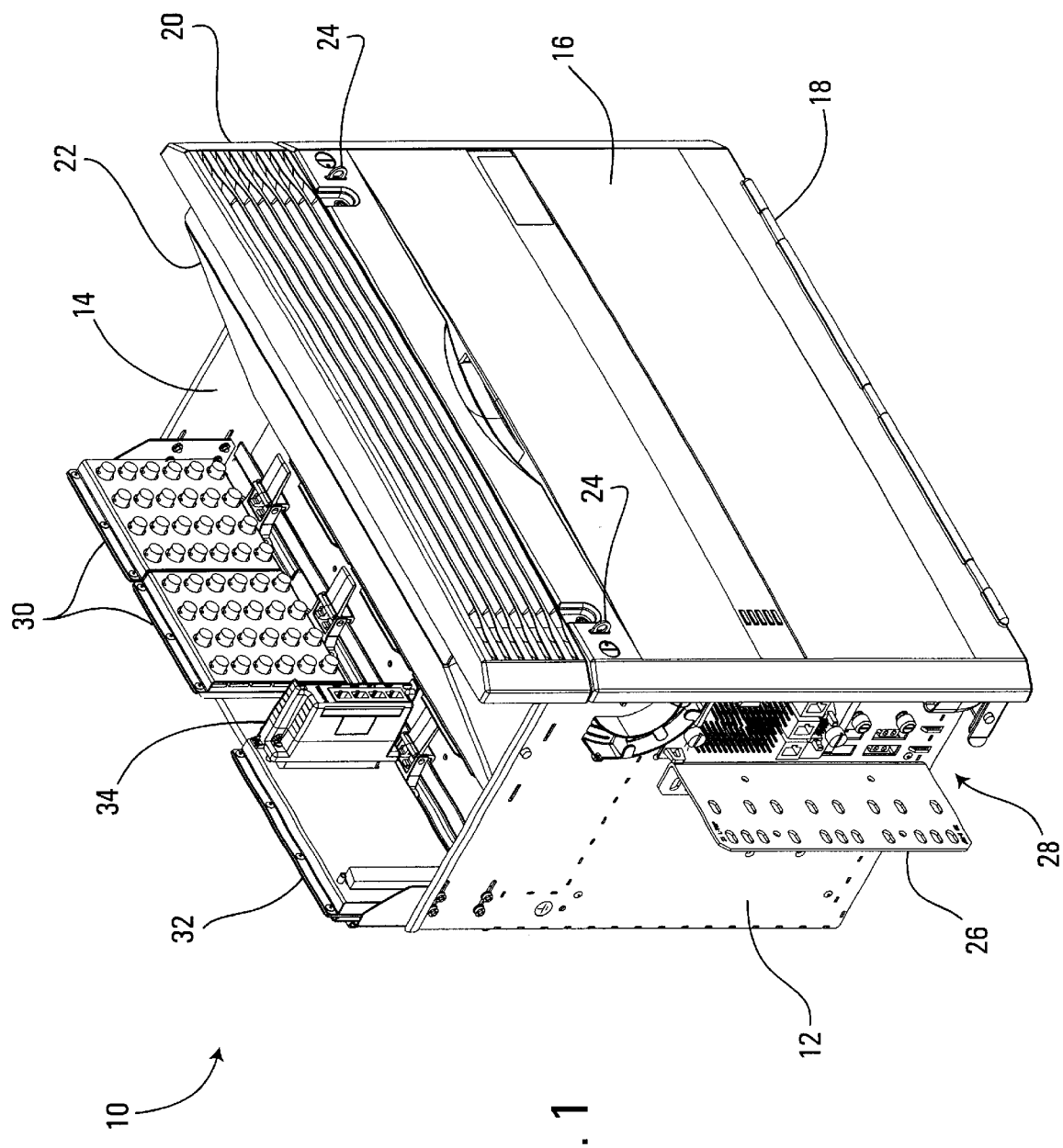
FIG. 1 depicts an isometric view of a shelf for housing PCPs in accordance with an embodiment of the present invention.

FIG. 1 shows a shelf 10 for housing PCPs, which may be part of a telephone switching system. It has an open front 11 (not visible in this figure) with a left side panel 12 and a right side panel 14 extending along the sides of the open front from a rear to a front of the shelf 10 to define a shelf space 13 (not visible in this figure). A front cover 16 provides electromagnetic interference (EMI) protection to the otherwise open shelf 10. The front cover 16 is hinged to the shelf 10 at a lower end by hinges 18 so that the front cover 16 hangs below the shelf 10 when the front cover 16 is in the open position. The front cover 16 is held in the closed position by lock brackets 24 which are attached to the left side panel 12 and the right side panel 14.

An air vent 20 is attached to the shelf 10 above the front cover 16. The air vent 20 has openings defined therethrough which allows airflow from the interior of the shelf 10 when the front cover 16 is in the closed position. An air deflector 22 deflects air which exits the shelf 10 after travelling upwards through the shelf 10.

Mounted on the left side panel 12 and the right side panel 14 are mounting brackets 26. Accessible through the left side panel 12 of the shelf 10 is a plurality of electrical connectors 28.

At the rear of the top of the shelf 10 are connector modules in accordance with the present invention. The examples of such modules depicted in FIG. 1 are coaxial cable connector modules 30 and a champ connector module 32. The champ connector module 32 has connected to it an RJ45 connector adapter 34.

Figure 2:
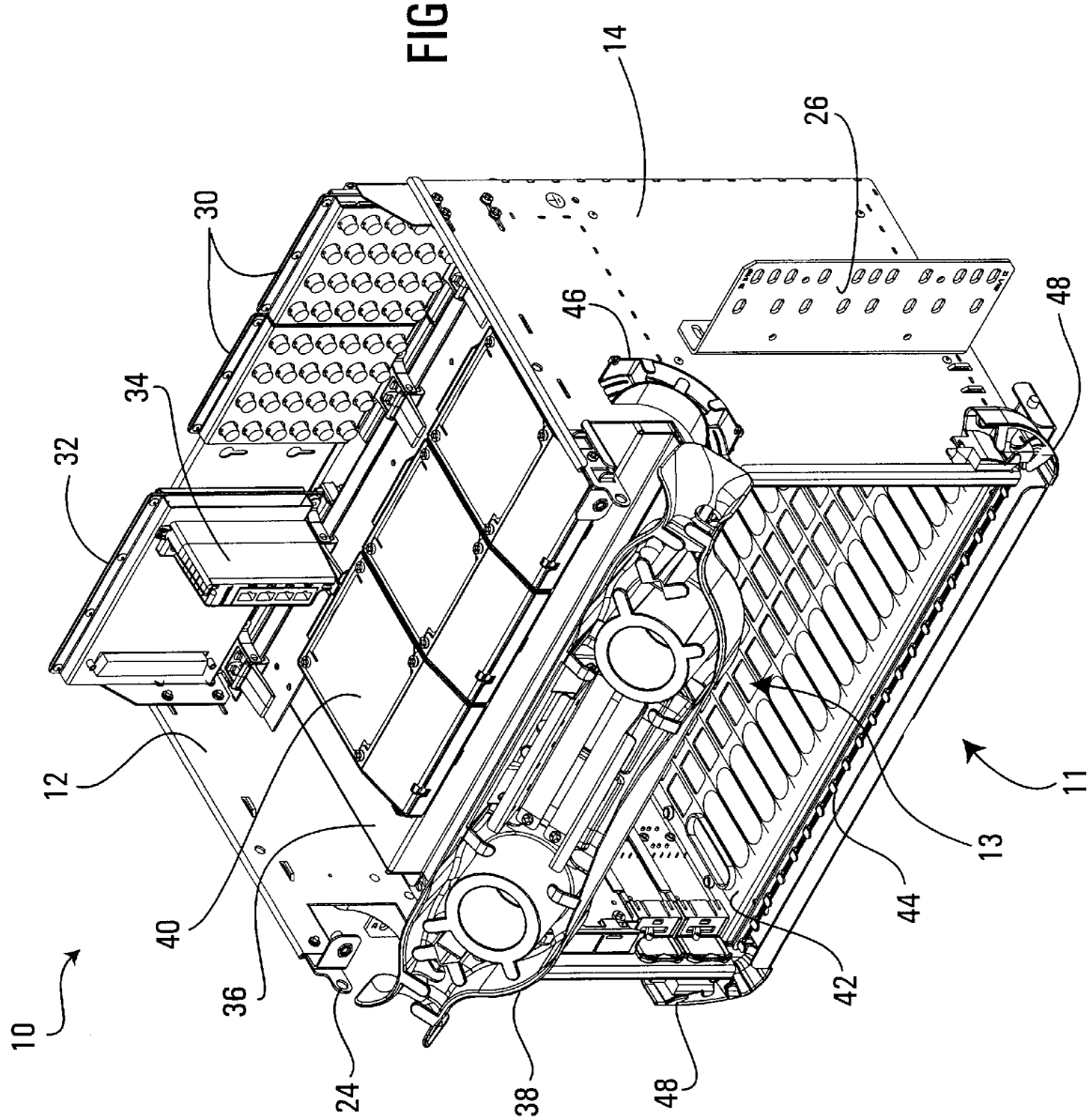
FIG. 2 depicts an isometric view of the shelf of FIG. 1 with the front cover removed and the front cable housing rotated forward.

FIG. 2 depicts a perspective view of the shelf 10 with the front cover 16 removed. The removal of the front cover 16 reveals the open front 11 and the shelf space 13. At the front of the shelf 10 is a fiber guide 38 which is hinged to the shelf 10. When the front cover 16 is in a closed position, as in FIG. 1, the fiber guide 38 is positioned behind the front cover 16. In FIG. 2, the fiber guide 38 is shown rotated forward such that the interior of the fiber guide 38 is visible. Also utilized for the positioning of fiber are a fiber bracket 44, fiber guides 46 and fiber guides 48.

Seated on a perforated top 36 of the shelf 10 are fan modules 40. When assembled, the upper surface of the fan modules 40 is below the lower surface of the connector modules. The function of the fan modules 40 is to draw air up through the shelf 10, which exits the shelf 10 through the air vent 20.

In the interior of the shelf 10 is a lower cross member 42 which, along with a similar upper cross member (not shown), is used to create a plurality of side-by-side receiving stations which guide PCPs into and hold PCPs within the shelf 10.

Figure 3:
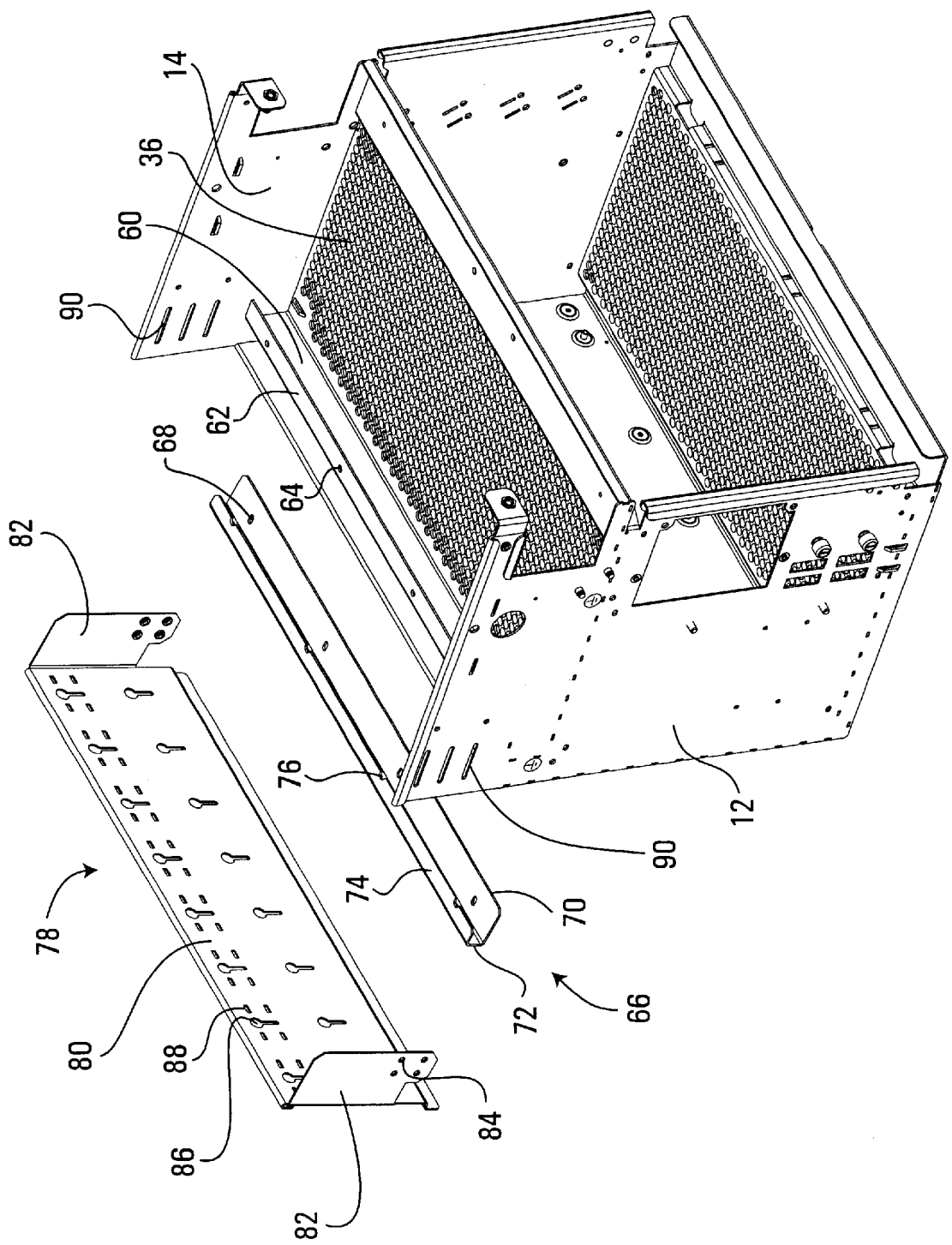
FIG. 3 depicts an exploded isometric view of some of the elements of the shelf of FIG. 1.

FIG. 3 depicts an exploded view of the components of the shelf 10 which provide mechanical support for connector modules. The top 36 of the shelf 10 is formed to have an unperforated vertical extension 60 extending perpendicular to the surface of the top 36 at a rear of top 36. A horizontal extension 62 of the top 36 is formed to extend horizontally from a top edge of a vertical extension 60. The horizontal extension 62 is parallel to the top 36 and extends horizontally over a rear of the top 36. The horizontal extension 62 has four holes 64 drilled through it.

A clamp bracket 66 is an elongated metal bracket formed to have a lower horizontal portion 70, a short vertical portion 72 and an upper horizontal portion 74. The lower horizontal portion 70 is significantly wider than the upper horizontal portion 74 and has four equally spaced elongated holes 68 drilled through it. The upper horizontal portion 74 has four equally spaced notches 76 defined in it. The notches 76 are aligned vertically above the elongated holes 68 and facilitate vertical access to the elongated holes 68. The clamp bracket 66 is fastened to the horizontal extension 62 of the top 36 by aligning the elongated holes 68 of the clamp bracket 66 with the holes 64 of the top 36 and inserting bolts through the aligned holes. Alternatively, other clamp means could be used.

A module support 78 has an elongated rear vertical portion 80 and vertical side portions 82. Each vertical side portion 82 has four holes 84 in a lower front area. The elongated rear vertical portion 80 has eight pairs of vertically aligned equally spaced keyholes 86. Each of the keyholes 86 has the elongated portion of the keyhole extending downwards. Also defined in the module support 78 are sixteen pairs of vertically aligned equally spaced horizontal slots 88. The horizontal slots 88 are vertically positioned in line with the top keyholes of the pairs of keyholes 86.

The module support 78 is connected to the left side panel 12 and the right side panel 14 by positioning the vertical side portions 82 inside the shelf 10 against the left side panel 12 and the right side panel 14. The holes 84 in the module support 78 are aligned with the slots 90 in the left side panel 12 and the right side panel 14. Bolts are inserted through the aligned holes and slots to secure module support 78 to left side panel 12 and right side panel 14.

FIGS. 4A, 4B and 4C respectively depict top, front and cross-sectional views of the shelf 10. In particular, a backplane 100 is fastened by screws 104 to a back 102 of the shelf 10. Mechanically and electrically connected to a front face of backplane 100 is a plurality of connectors 106. The connectors 106 are adapted to receive and mechanically and electrically connect PCPs to the backplane 100. At a top of the backplane 100 are edge connectors 108. The edge connectors 108 are vertically upwardly facing and are positioned behind the extension 60 of the top 36 and behind and below the clamp bracket 66.

The module support 78 is positioned above the edge connectors 108 and the rear vertical portion 80 of the module support 78 is positioned above the back 102 of the shelf 10. The module support 78 also has leaf springs 112 inserted into each pair of horizontal slots 88. Leaf springs 112 enable the electrical grounding of the connector modules.

Figure 11:
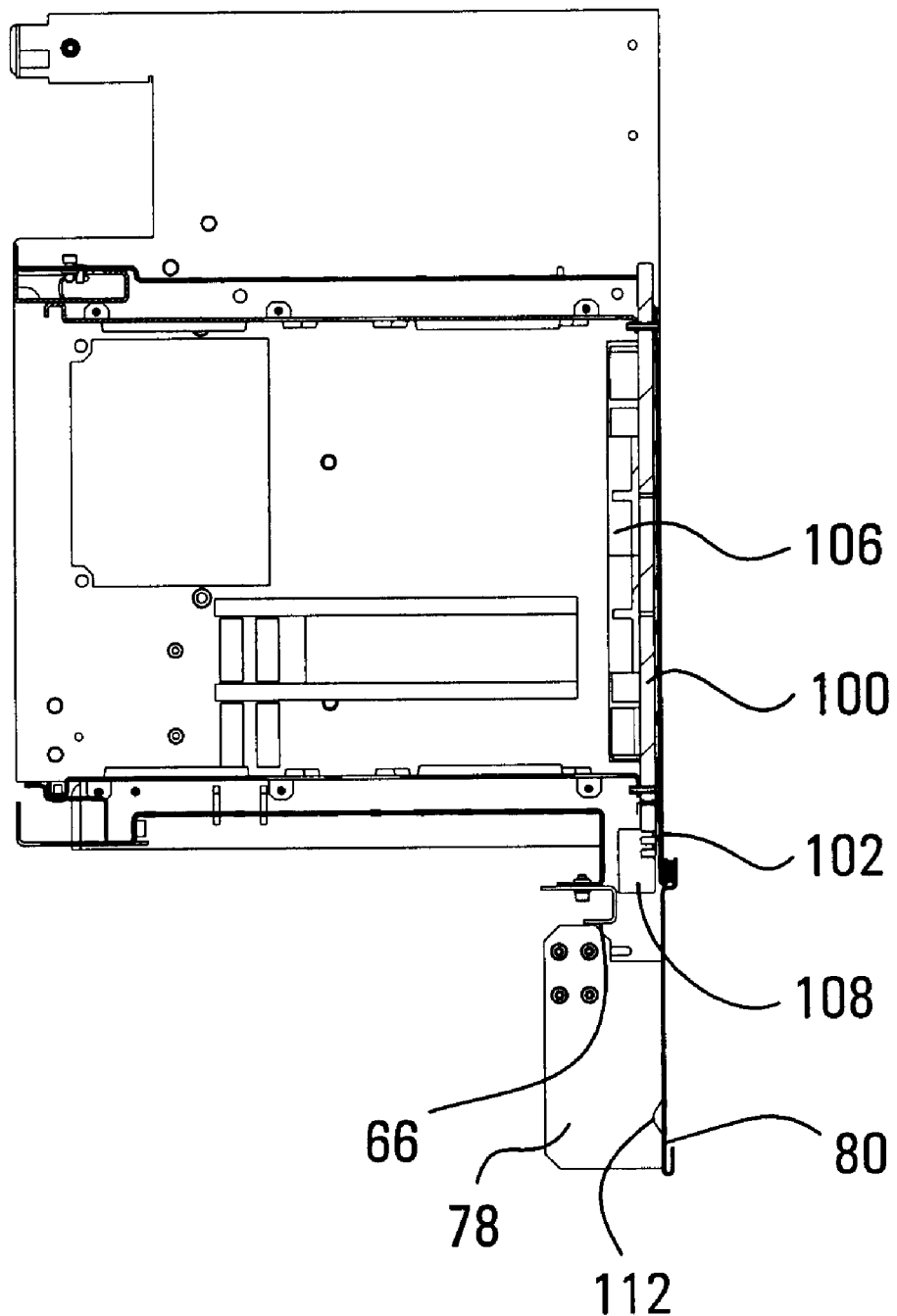
FIG. 11 depicts a cross-sectional view of a shelf for housing PCPs in accordance with another embodiment of the present invention.

Although edge connectors 108 are positioned along the top edge of backplane 100 in the embodiment depicted in FIGS. 1 to 4, the shelf 10 could equally be configured such that edge connectors 108 are positioned vertically downwardly facing along the bottom edge of backplane 100 (see, for example, FIG. 11).

Figure 5C:
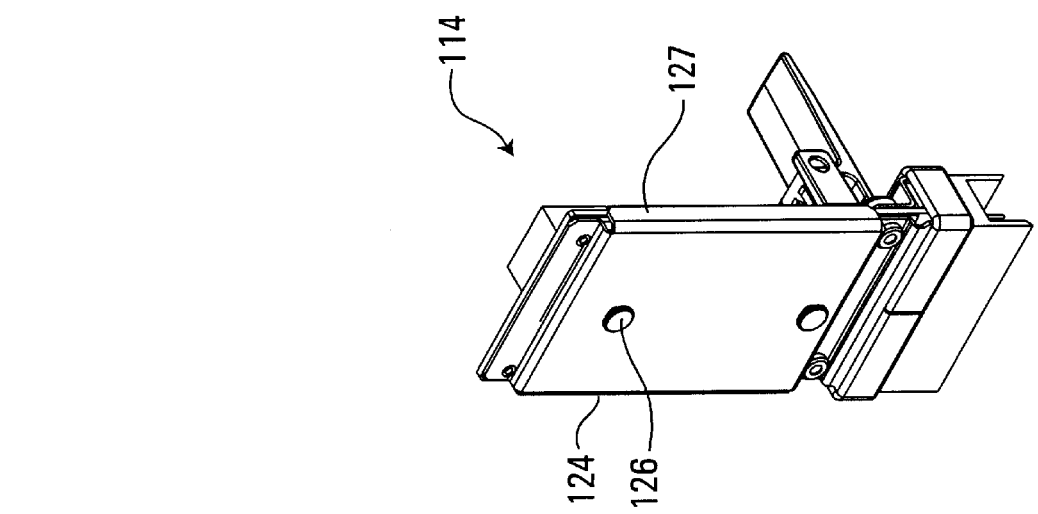
FIGS. 5A, 5B and 5C respectively depict a side view, an isometric front view and an isometric rear view of an RJ45 connector module in accordance with the present invention.
Figure 5B:
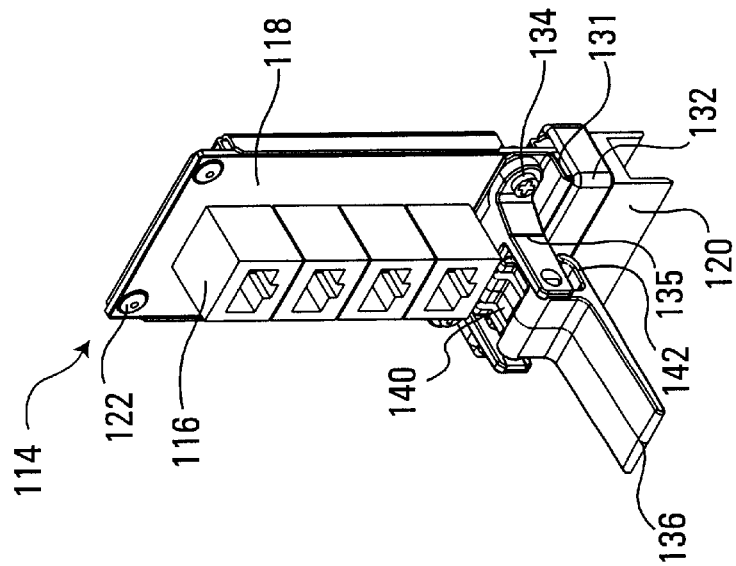
Figure 5A:
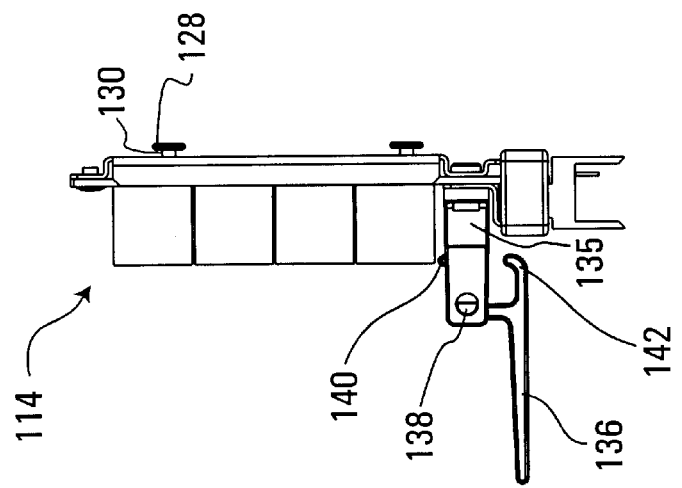

FIGS. 5A, 5B and 5C respectively depict a side view, an isometric front view, and an isometric rear view of an RJ45 connector module 114. The module 114 has four RJ45 connectors 116. However, it should be understood that the present invention contemplates different types, combinations and numbers of connectors as well as different widths of connector modules. The RJ45 connectors 116 are mechanically and electrically connected to a PC13 118. The PCB 118 provides electrical connection between the RJ45 connectors 116 and an edge connector 120. The edge connector 120 of the module 114 and the edge connectors 108 of the shelf 10 are complementary such that they can be releasably mated.

The PCB 118 is connected by rivets 122 to a back plate 124. The back plate 124 is comprised of steel and provides both EMI shielding and mechanical strength to the module 114. The edges 127 of the back plate 124 are curved to shield the edges of PCB 118. The back plate 124 has two studs 126 projecting therefrom which function as a keying means. The studs 126 are comprised of a head 128 and a stem 130. The studs 126 are vertically spaced substantially the same distance as the hole portion of the keyholes 86 of the module support 78 (see FIG. 4B). The head 128 of the studs 126 is smaller in diameter than the hole portion of the keyholes 86 and larger in diameter than the width of the slot portion of the keyholes 86. The stem 130 is smaller in diameter than the width of the slot portion of the keyholes 86. To assemble the module 114 to the module support 78, the heads 128 of the studs 126 are inserted through the hole portion of the keyholes 86. The module 114 is then moved downward such that the stems 130 are slid into the slot portion of the keyholes 86. The module 114 is thus retained in position against the module support 78. A steel EMI gasket 132 is positioned around the area where the PCB 118 is connected to the edge connector 120 and provides shielding of that connection. A front shield 131 is positioned horizontally over the top of the gasket 132 and extends vertically behind screws 134.

A latch support 135 is attached to the module 114 below the RJ45 connectors 116 by the screws 134. A latch 136 is pivotally mounted by a pin 138 to the latch support 135. The latch 136 has a latching projection 142 and a release projection 140. When the studs 126 are inserted into the keyholes 86 and slid downward (see FIG. 3), at the same time, the edge connector 120 is mated with one of the edge connectors 108. During such mating the latch 136 is held in a vertically rotated position so that the latching projection 142 will not hit the top of the upper horizontal portion 74 of the clamp bracket 66. As the module 114 is pushed down so that the edge connector 120 is mated with one of the edge connectors 108, latching projection 142 is hooked under upper horizontal portion 74 of clamp bracket 66 (see FIG. 4C). When the edge connector 120 is almost fully mated with one of the edge connectors 108, the latch 136 is manually rotated to a horizontal position in which the latching projection 142 is hooked under and forced against a bottom surface of the upper horizontal portion 74 of the clamp bracket 66 (see FIG. 3) thereby firmly mating one of the edge connectors 108 to the edge connector 120.

When connected, the module 114 extends vertically above, in line with, and substantially parallel to the backplane 100. Once the module 114 is connected to the backplane 100, a plurality of cables may be connected to the forwardly facing RJ45 connectors 116 over the top 36 of the shelf 10.

To disconnect the edge connector 120 from one of the edge connectors 108, the latch 136 is manually rotated in so that the latching projection 142 is rotated out from beneath the upper horizontal portion 74 of the clamp bracket 66 and the release projection 140 is pressed against a top surface of the upper horizontal portion 74 (see FIG. 3). The force of the release projection 140 against the top surface of the upper horizontal portion 74 serves to force the module 114 upward thereby unlocking edge connector 120 of module 114 from one of the edge connectors 108. The edge connector 120 can then be completely disconnected from one of the edge connectors 108 by manually lifting the module 114 upwards.

Figure 6B:
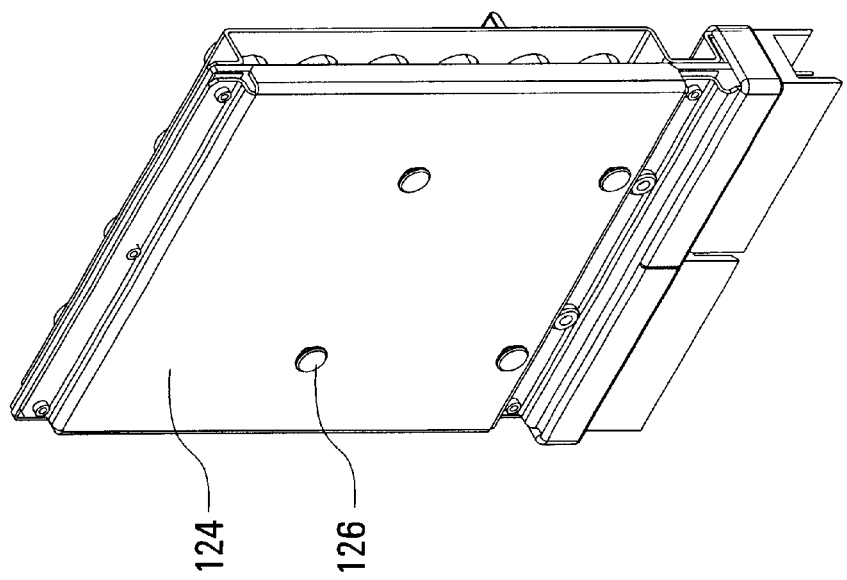
FIGS. 6A and 6B respectively depict an isometric front view and an isometric rear view of a coaxial connector module in accordance with the present invention.
Figure 6A:
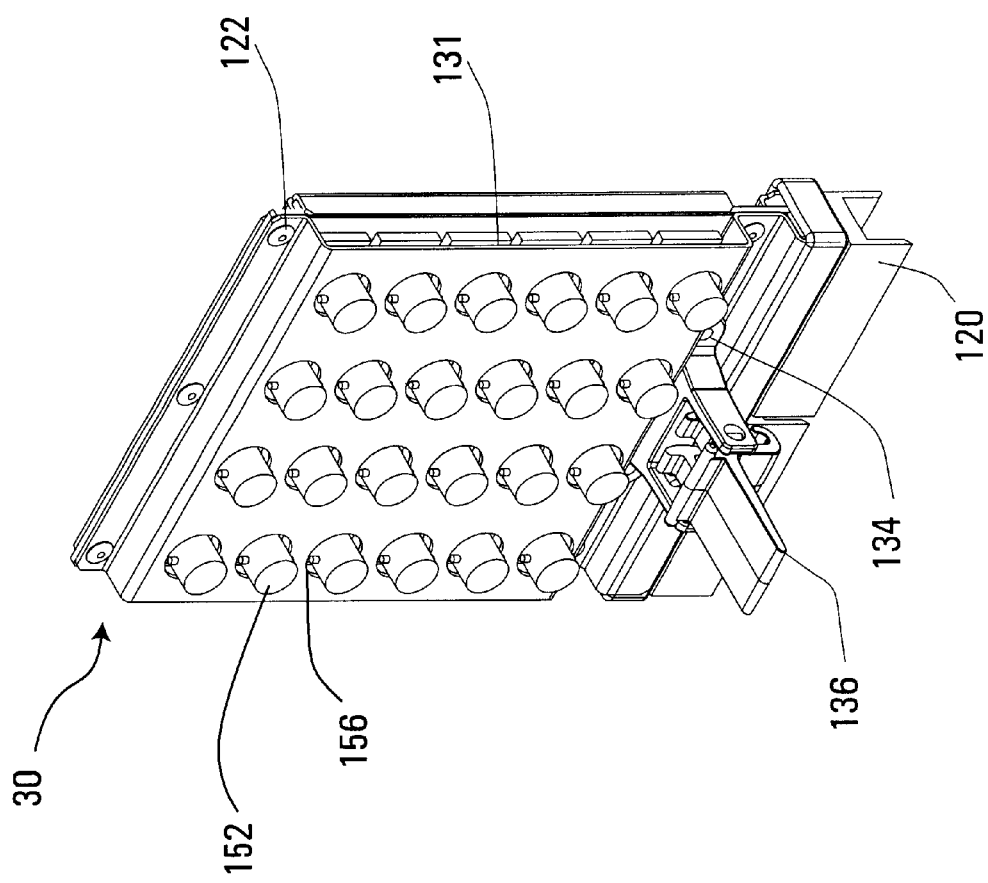
Figure 7A:
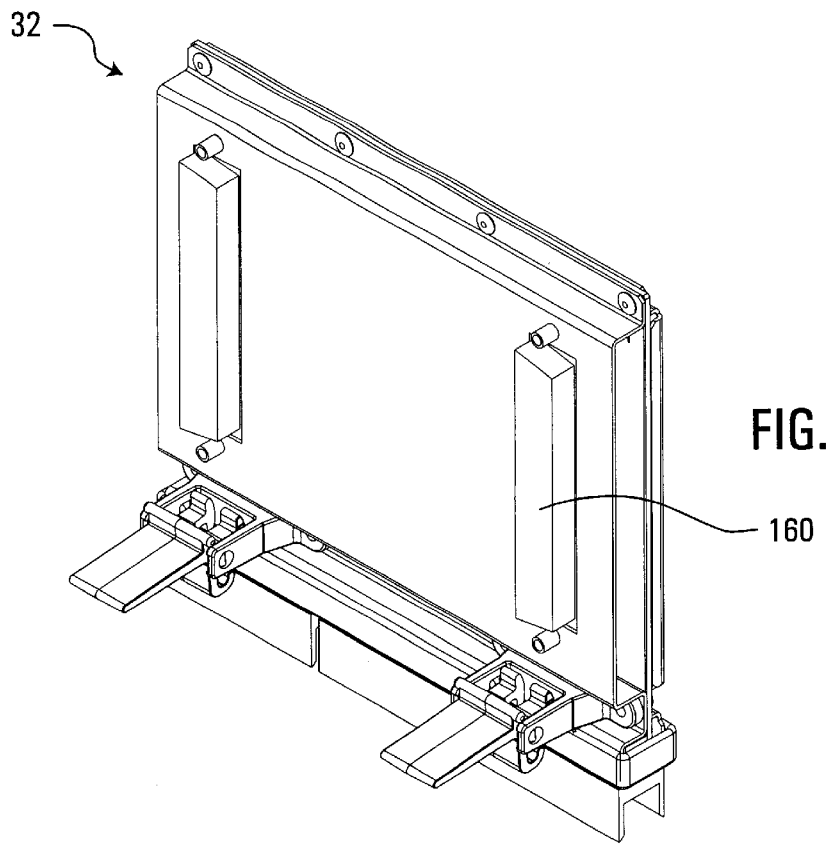
FIGS. 7A and 7B respectively depict an isometric front view and an isometric rear view of a champ connector module in accordance with the present invention.
Figure 7B:
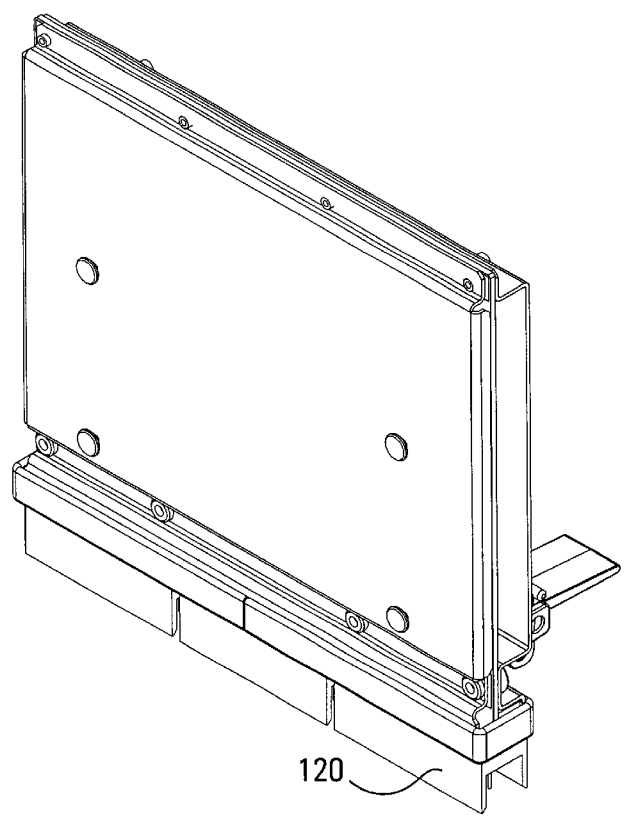
Figure 8A:
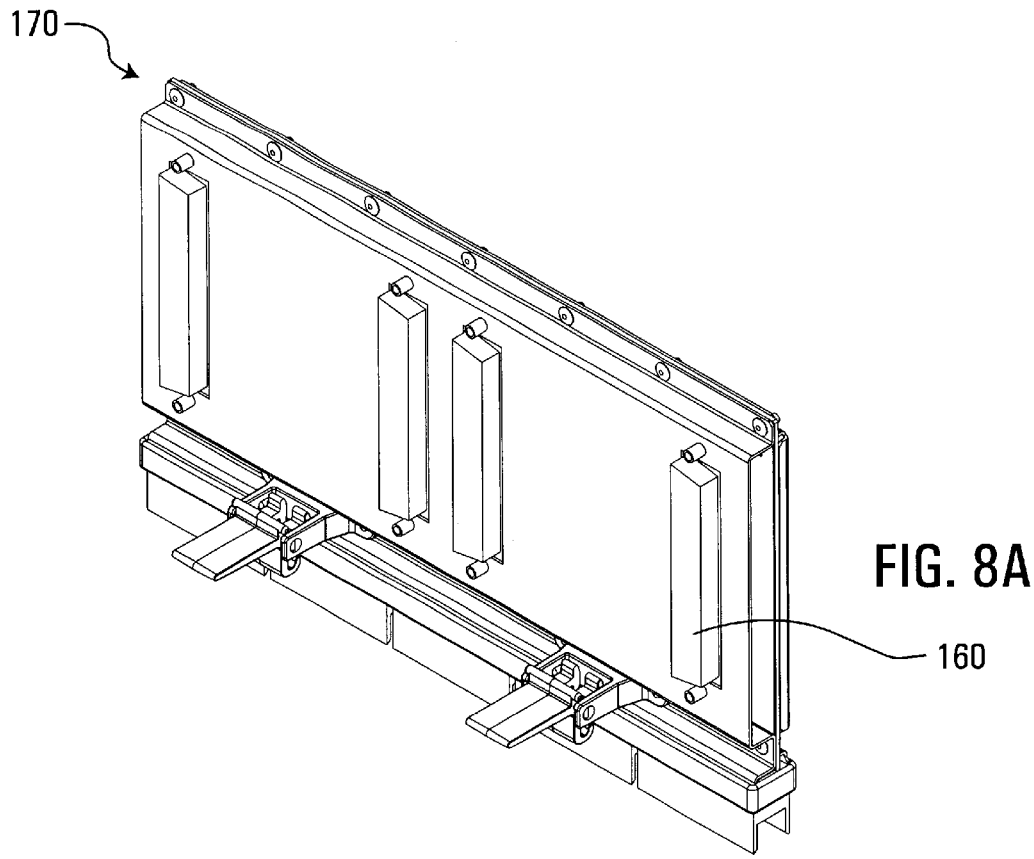
FIGS. 8A and 8B respectively depict an isometric front view and an isometric rear view of a larger champ connector module in accordance with the present invention.
Figure 8B:
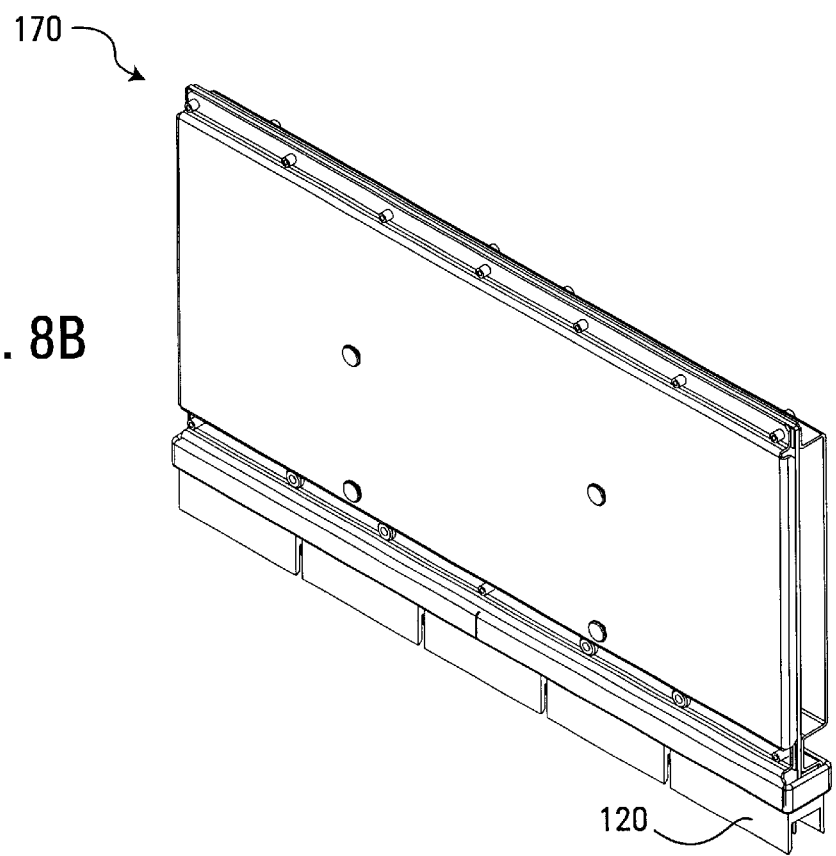

FIGS. 6A and 6B depict the coaxial cable connector module 30 (also depicted in FIG. 1) which has a plurality of co-axial connectors 152. Other than having a different type of cable connector, the coaxial cable connector module 30 is constructed and connected to the shelf 10 substantially the same as the module 114. The coaxial cable connector module 30 has the same stud 126 attachment mechanism and the same latch 136 attachment mechanism as the module 114. The coaxial cable connector module 30 also has the same type of edge connector 120 which is adapted to connect to one of the edge connectors 108 of the shelf 10. However, the coaxial cable connector module 30 is twice as wide as the module 114 and consequently has two connectors 120 whereas the module 114 has only one. This means that when the coaxial cable connector module 30 is mated with one of the edge connectors 108, it occupies twice as much width as the module 114. The present invention allows the use of modules of such differing widths. Also in the coaxial cable connector module 30, the shield 131 extends behind the screws 134 and vertically up the entire height of the coaxial cable connector module 30 and is riveted at the top by the rivets 122. The shield 131 has holes 156 defined therethrough to accommodate the co-axial connectors 152.

FIGS. 7A and 7B and FIGS. 8A and 8B depict champ connector module configurations 32 and 170 respectively. The modules 32 and 170 have the same basic configuration as the modules 114 and 30 depicted in FIGS. 5 and 6 respectively. The modules 32 and 170 connect to the shelf 10 in the same way as described in reference to the module 114. However, the modules 32 and 170 have different connectors 160 and are wider than the modules 114 and 30. Thus, the module 32 has three connectors 120 and the module 170 has five connectors 120. As previously discussed, the edge connectors 108 (see FIG. 4A) are designed to accommodate the attachment of modules of differing widths to the shelf 10.

Figure 9:
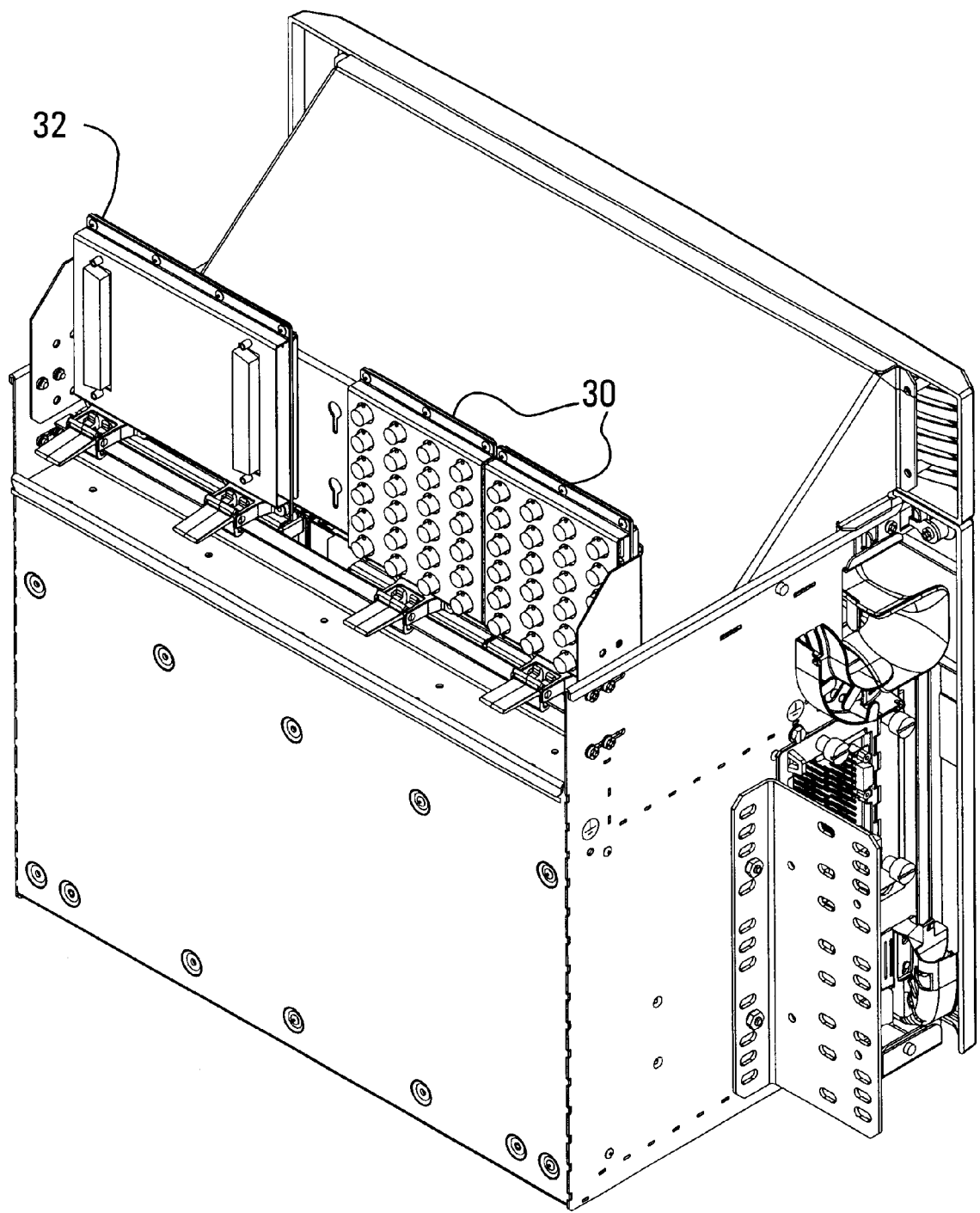
FIG. 9 depicts an isometric view of a shelf for housing PCPs in accordance with a second embodiment of the present invention.
Figure 10:
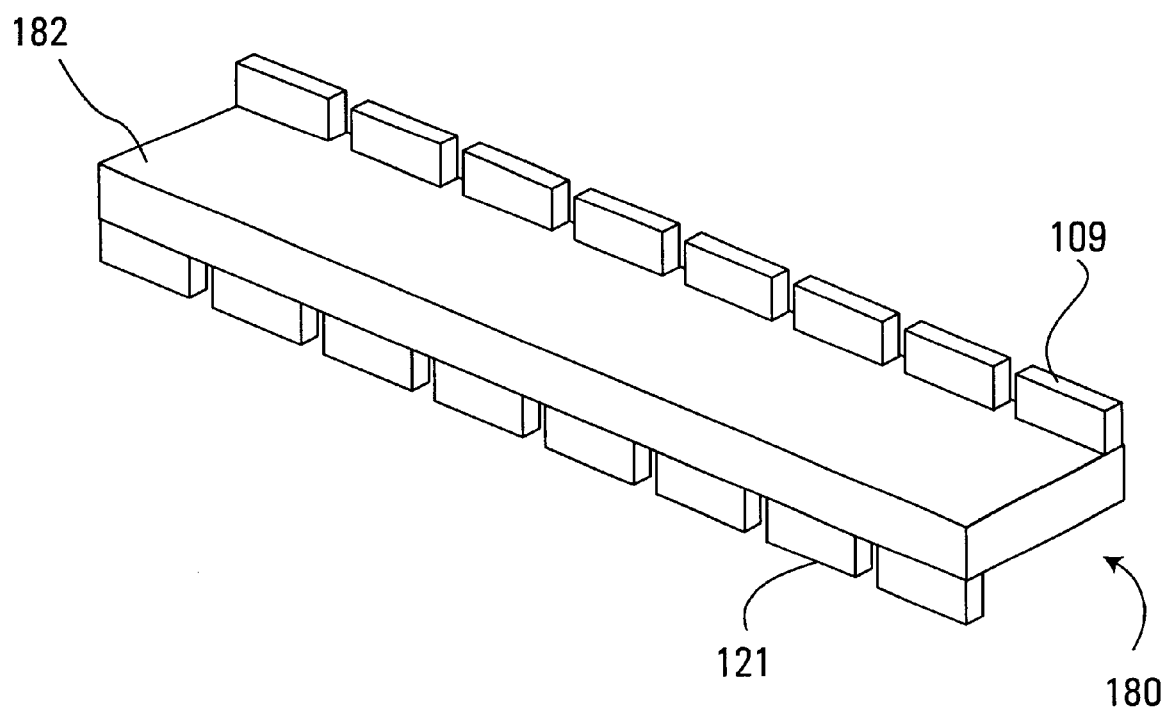
FIG. 10 depicts an adapter for adapting electrical signals of the front facing connector modules to face the rear in accordance with the embodiment of FIG. 9.

FIG. 9 depicts another embodiment of the present invention. In this embodiment, the modules 30 and 32 are mounted on the shelf 10 in the rear facing direction. Not shown explicitly in FIG. 9 is a connector adapter which is interposed between the backplane and the modules and electrically connected to them. FIG. 10 depicts such a connector adapter 180 which serves two purposes. First, the connector adapter 180 is used to transpose the electrical signals carried in the backplane 100 so that the same modules can be used for both the front facing configuration of FIG. 1 and the rear facing configuration of FIG. 9. Second, the connector adapter 180 horizontally moves the modules to sit more forwardly than the backplane 100 so that the connectors on the now rear face of the modules and the cables connected to those connectors do not extend rearwardly beyond the backplane 100.

The connector adapter 180 comprises connectors 121 mechanically and electrically connected to the bottom of a PCB 182. The PCB 182 transposes the electrical connections from the connectors 121 and connects to connectors 109 on the top of the PCB 182 which are offset horizontally from the connectors 121. Thus, in operation, connectors 121 are connected to the edge connectors 108 of the backplane 100 of shelf 10 and modules, such as modules 30 and 32, are inserted into connectors 109, which are forward of the connectors 108, the modules being inserted in the rear facing direction. To accommodate this configuration, clamp bracket 66 and module support 78 are also screwed to shelf 10 in a rear facing direction.

All structural parts of shelf 10 are cold rolled steel finished with zinc electroplate with supplementary molybdenumphosphate coating.

The above description of embodiments should not be interpreted in any limiting manner since variations and refinements can be made without departing from the spirit of the invention. The scope of the invention is defined by the appended claims and their equivalents.

What is claimed is:

1. A shelf for housing printed circuit boards comprising:
   an open front;
   a pair of sides extending from a rear to the open front of the shelf, the sides being spaced apart at opposite ends of a shelf space;
   a backplane extending across the rear of the shelf;
   a plurality of side-by-side receiving stations located in the shelf space for printed circuit boards to be received through the open front for connection to the backplane;
   at least one connector module releasably electrically connected to the backplane and extending vertically from and substantially parallel to the backplane;
   the connector module having a plurality of connectors which extend in a front to rear direction of the shelf;
   wherein the backplane is significantly wider than the connector module such that a plurality of connector modules can be connected to the backplane along the width of the backplane.

2. The shelf of claim 1 wherein the at least one connector module extends vertically above the backplane.

3. The shelf of claim 1 wherein the at least one connector module extends vertically below the backplane.

4. The shelf of claim 1 wherein the connectors face forwardly for frontal access.

5. The shelf of claim 4 wherein the at least one connector module is located directly vertically in line with the backplane.

6. The shelf of claim 1 wherein the connectors face rearwardly for rear access.

7. The shelf of claim 6 wherein the at least one connector module is offset forwardly of the backplane.

8. The shelf of claim 1 wherein the at least one connector module comprises a printed circuit board having a plurality of connectors mounted thereon.

9. The shelf of claim 8 wherein the backplane has at least one vertically facing edge connector which is adapted to mate with a vertically facing edge connector on the connector module.

10. The shelf of claim 1 further comprising;
    at least one vertically facing connector electrically connected to the backplane and extending a long an edge of the backplane;
    at least one connector adapter having a first connector and a second connector offset from the first connector;
    the first connector adapted for electrical connection to the backplane; the second connector adapted for electrical connection to the at least one connector module;
    the connector adapter being interposed between and electrically connected to the backplane and the at least one connector module such that the at least one connector module is positioned forwardly of the backplane to accommodate rear facing connectors without extending rearwardly beyond the backplane.

11. A shelf for housing printed circuit boards comprising:
    an open front;
    a pair of sides extending from a rear to the open front of the shelf, the sides being spaced apart at opposite ends of a shelf space;
    a backplane extending across the rear of the shelf;
    a plurality of side-by-side receiving stations located in the shelf space for printed circuit boards to be received through the open front for connection to the backplane;
    at least one connector module releasably electrically connected to the backplane and extending vertically from and substantially parallel to the backplane, the connector module having a plurality of connectors which extend in a front to rear direction of the shelf,
    a module support extending vertically from the backplane and connected between the sides of the shelf; and
    a keying means on a rear face of the connector module, the module support being adapted to receive the keying means and retain and support the connector module when ii is electrically connected to the backplane.

12. The shelf of claim 11 further comprising an electromagnetic interference shield plate connected to the rear of the connector module wherein the keying means is integrally connected to the electromagnetic interference shield plate.

13. A shelf for housing printed circuit boards comprising:
    an open front;
    a pair of sides extending from a rear to the open front of the shelf, the sides being spaced apart at opposite ends of a shelf space;
    a backplane extending across the rear of the shelf;
    a plurality of side-by-side receiving stations located in the shelf space for printed circuit boards to be received through the open front for connection to the backplane;
    at least one connector module releasably electrically connected to the backplane and extending vertically from and substantially parallel to the backplane, the connector module having a plurality of connectors which extend in a front to rear direction of the shelf;
    a clamp means extending horizontally at the rear of the shelf and attached to the shelf;
    a latch means pivotally attached to the connector module such that when the connector module is connected to the backplane, the latch means may be manually pivoted to latch to the clamp means thereby locking the connector module to the shelf; and
    a release means fixedly attached to the latch means such that when the latch means is manually pivoted in the reverse of the latching direction, the release means unlatches the latch means from the clamp means thereby unlocking the connector module from the shelf.

14. A shelf for housing printed circuit boards comprising:
    an open front;
    a pair of sides extending from a rear to the open front of the shelf, the sides being spaced apart at opposite ends of a shelf space;
    a backplane extending a cross the rear of the shelf,
    a plurality of side-by-side receiving stations located in the shelf space for printed circuit boards to be received through the open front for connection to the backplane; and a connector module, adapted for connection to the backplane, the backplane being significantly wider than the connector module such that a plurality of connector modules can be connected to the backplane along the width of the backplane, the connector module comprising:
- a printed circuit board;
- a plurality of cable connectors mechanically and electrically connected to the printed circuit board and extending substantially perpendicular to the printed circuit board; and
- an edge connector mechanically and electrically connected to an edge of a printed circuit board;
- wherein the edge connector is adapted to releasably mare with an edge connector on the backplane such that the module extends vertically from and substantially parallel to the backplane.

15. A shelf for housing printed circuit boards comprising:
an open front;
a pair of sides extending from a rear to the open front of the shelf, the sides being spaced apart at opposite ends of a shelf space;
a backplane extending across the rear of the shelf;
a plurality of side-by-side receiving stations located in the shelf space for printed circuit boards to be received through the open front for connection to the backplane; and
a connector module adapted for connection to the backplane, the connector module comprising:
- a printed circuit board;
- a plurality of cable connectors mechanically and electrically connected to the printed circuit board and extending substantially perpendicular to the printed circuit board;
- an edge connector mechanically and electrically connected to an edge of a printed circuit board, the edge connector adapted to releasably mate with an edge connector on the backplane such that the module extends vertically from and substantially paralle to the backplane; and
- a keying means on a rear face which is adapted to connect to a module support.

16. The shelf of claim 15 further comprising an electromagnetic interference plate connected to a rear of the connector module wherein the keying means is integrally connected to the electromagnetic interference plate.

17. A shelf for housing printed circuit boards comprising:
an open front;
a pair of sides extending from a rear to the open front of the shelf, the sides being spaced apart at opposite ends of a shelf space;
a backplane extending across the rear of the shelf;
a plurality of side-by-side receiving stations located in the shelf space for printed circuit boards to be received through the open front for connection to the backplane; and
a connector module adapted for connection to the backplane, the connector module comprising:
- a printed circuit board;
- a plurality of cable connectors mechanically and electrically connected to the printed circuit board and extending substantially perpendicular to the printed circuit board;
- an edge connector mechanically and electrically connected to an edge of a printed circuit board, the edge connector adapted to releasably mate with an edge connector on the backplane such that the module extends vertically form and substantially parallel to the backplane;
- a latch means pivotally attached to the connector module which is adapted to lock the connector module to the backplane; and
- a release means, fixedly attached to the latch means, which is adapted to unlock the connector module from the backplane.

18. A backplane and connector module assembly for use with a shelf for housing printed circuit boards comprising:
at least one connector module releasably electrically and mechanically connected to the backplane and extending vertically from and substantially parallel to the backplane;
the connector module having a plurality of connectors each of which extends in a front to rear direction of the backplane;
wherein the backplane is significantly wider than the connector module such that a plurality of connector modules can be connected to the backplane along the width of the backplane.

19. The assembly of claim 18 wherein the at least one connector module extends vertically above the backplane.

20. The assembly of claim 18 wherein the at least one connector module extends vertically below the backplane.

21. The assembly of claim 18 wherein the at least one connector module is offset forwardly of the backplane.

22. The assembly of claim 18 wherein the at least one connector module comprises a printed circuit board having a plurality of connectors mounted thereon.

23. The assembly of claim 18 wherein the backplane has at least one vertically facing edge connector which is adapted to mate with a vertically facing edge connector on the bottom of the connector module.

24. The assembly of claim 18 further comprising:
at least one vertically facing connector electrically connected to the backplane and extending along an edge of the backplane;
at least one connector adapter having a first connector and a second connector offset from the first connector;
the first connector adapted for electrical connection to the backplane;
the second connector adapted for electrical connection to the at least one connector module;
the connector adapter being interposed between and electrically connected to the backplane and the at least one connector module such that the at least one connector module is positioned forwardly of the backplane to accommodate rear facing connectors without extending rearwardly beyond the backplane.

25. A backplane and connector module assembly for use with a shelf for housing printed circuit boards comprising:
at least one connector module releasably electrically and mechanically connected to the backplane and extending vertically from and substantially parallel to the backplane;
the connector module having a plurality of connectors each of which extends in a front to rear direction of the backplane;
wherein the connector module comprises a keying means on a rear face which is adapted to connect to a module support.

26. The assembly of claim 25 further comprising an electromagnetic interference plate connected to a rear of the connector module wherein the keying means is integrally connected to the electromagnetic interference plate.

27. A backplane and connector module assembly for use with a shelf for housing printed circuit boards comprising:

at least one connector module releasably electrically and mechanically connected to the backplane and extending vertically from and substantially parallel to the backplane;

the connector module having a plurality of connectors each of which extends in a front to rear direction of the backplane;

wherein the connector module comprises a latch means pivotally attached to the connector module which is adapted to lock the connector module to the backplane and a release means, fixedly attached to the latch means, which is adapted to unlock the connector module from the backplane.

* * * * *